(12) United States Patent
Roy

(10) Patent No.: US 8,030,774 B2
(45) Date of Patent: Oct. 4, 2011

(54) IMAGING DEVICE EQUIPPED WITH A LAST COPPER AND ALUMINUM BASED INTERCONNECTION LEVEL

(75) Inventor: François Roy, Seyssins (FR)

(73) Assignee: STMicroelectronics SA, Montrouge (FR)

( * ) Notice: Subject to any disclaimer, the term of this patent is extended or adjusted under 35 U.S.C. 154(b) by 672 days.

(21) Appl. No.: 11/961,202

(22) Filed: Dec. 20, 2007

(65) Prior Publication Data

US 2008/0185585 A1   Aug. 7, 2008

(30) Foreign Application Priority Data

Dec. 22, 2006   (FR) ...................................... 06 55895

(51) Int. Cl.
*H01L 23/48*   (2006.01)
*H01L 23/52*   (2006.01)
(52) U.S. Cl. ................. 257/758; 257/774; 257/E23.142
(58) Field of Classification Search .................. 257/758, 257/774, E23.142
See application file for complete search history.

(56) References Cited

U.S. PATENT DOCUMENTS

| | | | | |
|---|---|---|---|---|
| 4,789,648 A * | 12/1988 | Chow et al. | | 438/633 |
| 6,664,632 B2 * | 12/2003 | Duesman et al. | | 257/750 |
| 7,397,125 B2 * | 7/2008 | Oda | | 257/758 |
| 2001/0045655 A1 * | 11/2001 | Matsubara | | 257/758 |
| 2002/0139572 A1 | 10/2002 | Morozumi | | 174/255 |
| 2003/0164532 A1 * | 9/2003 | Liu et al. | | 257/529 |
| 2004/0140564 A1 | 7/2004 | Lee et al. | | 257/758 |
| 2004/0245637 A1 * | 12/2004 | Horak et al. | | 257/758 |
| 2005/0242402 A1 | 11/2005 | Ohkawa | | 257/369 |
| 2006/0163734 A1 * | 7/2006 | Thei et al. | | 257/758 |

* cited by examiner

*Primary Examiner* — Nitin Parekh
(74) *Attorney, Agent, or Firm* — Lisa K. Jorgenson; Allen, Dyer, Doppelt, Milbrath & Gilchrist, P.A.

(57) ABSTRACT

A microelectronic device may include a substrate, a plurality of components on the substrate, an insulating layer adjacent the substrate, and a plurality of metallic interconnection levels within the insulating layer and for the plurality of components. The plurality of metallic interconnection levels may include at least one given metallic level including a plurality of conductive lines of a first metallic material, and at least one other metallic level adjacent the at least one given metallic level. The at least one other metallic level may include at least one conductive zone of the first metallic material and coupled to at least one of the plurality of conductive lines of the at least one given metallic level, and at least one other conductive zone of a second metallic material and coupled to at least one other of the plurality of conductive lines of the at least one given metallic level.

16 Claims, 2 Drawing Sheets

IMAGING DEVICE EQUIPPED WITH A LAST COPPER AND ALUMINUM BASED INTERCONNECTION LEVEL

FIELD OF THE INVENTION

The invention relates to the field of microelectronics, and in particular that of interconnections in integrated circuits.

The invention makes improvements to the size and the flatness of the integrated circuits and particularly applies to imaging devices or image sensors.

BACKGROUND OF THE INVENTION

The new generations of integrated circuits have several levels of copper based interconnections made using Damascene technology. Complementary Metal Oxide Semi-conductor (CMOS) image sensor type integrated circuits generally include, in addition to the various copper based interconnection levels, a last aluminum based metal level, that may be dedicated to the assembly, for example, by welding, of the integrated circuit with a circuit package, and/or to the testing of the integrated circuit.

In FIG. 1, an example of an image sensor device of the prior art is shown. This device has 4 levels of interconnections, L1, L2, L3, L4, of which 3 levels, L1, L2, L3, are formed by copper based interconnections. A last level, L4, is aluminum based. The first level features interconnection lines 10a positioned opposite the active matrix pixels (shown by a block reference 50) of the sensor, interconnection lines 10b positioned opposite one or several processing and/or command analog and/or digital circuits (shown by a block reference 52), and interconnection lines 10c opposite an interface circuit (shown by a block reference 54).

The second level L2 features interconnection lines 20a positioned opposite the pixels, as well as interconnection lines 20b positioned opposite the circuits 52. Interconnection lines 20c are positioned opposite the circuit 54 dedicated to testing. The third level L3 features interconnection lines 30a positioned opposite the active matrix pixels 50, interconnection lines 30b positioned opposite the several circuits 52, and interconnection lines 30c opposite a circuit equipped with dedicated components, for example, for testing the sensor.

The last level L4 of interconnections includes aluminum based pads 40 created on the periphery of the sensor, and positioned opposite the electrical interface circuit 54. This last level L4 poses a problem, as shown in FIG. 1, in that the dielectric layer and the passivated layer 62 covering the four metallic levels, L1, L2, L3, L4, are not flat. This lack of flatness may lead to non-uniformity in the thickness of the color filter 64, made, for example, by spin coating a colored resin onto the passivated layer 62. Filters of different thicknesses induce a non-uniform optical response from the sensor.

To overcome this problem, a method may be used which deposits an additional dielectric thickness followed by CMP (Chemical Mechanical Polishing). However, the additional dielectric thickness increases the distance between the microlenses 66 on the color filter and the photodiodes of the active matrix 50, which causes a drop in the optical performances of the device, especially in terms of quantum efficiency, crosstalk, and angular response.

SUMMARY OF THE INVENTION

The invention relates to the manufacture or fabrication of an integrated circuit, for example, such as imaging devices or image sensors, equipped with a plurality of superposed metallic interconnection levels. The last interconnection level may not only include conductor pads dedicated to the assembly and/or the testing of the integrated circuit, but may also include one or several conductive interconnection lines of integrated circuit components.

The invention also relates to the fabrication of an integrated circuit, for example, such as imaging devices or image sensors, equipped with a plurality of superposed metallic interconnection levels in which at least one interconnection level includes one or several conductive lines based on a first metallic material, for example, for interconnections of integrated circuit components. The at least one interconnection level may include one or several other conductive zones based on a second metallic material, for example, pads for the assembly with a circuit package and/or pads for testing the integrated circuit. What is meant by the last interconnection level is the interconnection level the farthest from the substrate among the various superposed interconnection levels.

The invention also relates to a microelectronic device and may comprise a plurality of components formed on a substrate, and a plurality of superposed metallic levels of component interconnections, wherein the metallic levels are located in an insulating layer resting on the substrate. The substrate may comprise at least one given metallic level and may comprise a plurality of conductive lines based on a first metallic material and at least one other level positioned on the given level. The given level may comprise one or several conductive zones based on the first metallic material, and respectively connected to at least one conductive line of said given level, and one or several other conductive zones based on a second metallic material and respectively connected to at least one other conductive line of the given level.

The conductive lines of the given metallic level may be positioned in a same plane parallel to the main plane of the substrate. The other level may be the last level of interconnections, or one of the last levels of the superposition of metallic interconnection levels, wherein the first interconnection level is defined as the metallic level closest to the substrate in the superposition of metallic interconnection levels.

According to one embodiment, one or several conductive zones among the conductive zones based on the second metallic material may be respectively revealed by at least one opening in the insulating layer. In the other level, the conductive zones, based on the first metallic material, may be covered by a thickness of said insulating layer. The conductive zones, based on the second metallic material, may include one or several conductor pads designed for the interconnection with a circuit package and/or one or several conductor pads for testing the integrated circuit. The conductive zones, based on the second metallic material, may comprise one or several conductive lines for the interconnection of the microelectronic device components.

The first metallic material may be a material selected for its electrical conductive properties. The first metallic material may be a better conductor of electricity than the second metallic material. The first metallic material may be a metal, such as copper. The second metallic material may be more resistant to corrosion than the first metallic material. The second metallic material may also be a material that is easier to weld than the first material. The second metallic material may be a metal, such as aluminum.

The invention relates to an image sensor or an imaging device including a microelectronic device as defined above.

The invention also relates to a manufacturing method for a microelectronic device and may include the creation of a plurality of components formed on a substrate, and the creation of a plurality of superposed metallic interconnection levels of components located in an insulating layer resting on the substrate. The metallic levels may include at least one given level comprising a plurality of conductive lines based on a first metallic material and at least one other level positioned on the given level and including one or several conductive zones based on the first metallic material and respectively connected to at least one conductive line of said given level. The plurality of conductive lines may also include one or several other conductive zones based on a second metallic material and respectively connected to at least one other conductive line of the given level. According to one possibility, the conductive lines of the given metallic level may be positioned in a same plane parallel to the main plane of the substrate.

The method may also include the creation of at least one opening in the insulating layer revealing one or several of the other conductive zones based on the second metallic material. The first metallic material may be a better conductor of electricity than the second metallic material. The first metallic material may be a metal, such as copper. The second metallic material may be a material that is easier to weld than the first metallic material. The second metallic material may be a metal, such as aluminum. The microelectronic device may be an imaging device or an image sensor.

BRIEF DESCRIPTION OF THE DRAWINGS

This invention will be more clearly understood upon reading the description of examples of embodiments provided purely by way of non-restrictive example in reference to the appended drawings in which.

Identical, similar or equivalent parts of the various figures have the same numerical references so as to facilitate the passage from one figure to another. The various parts shown in the figures are not necessarily to a uniform scale, in order to make the figures more legible.

Figure 1:
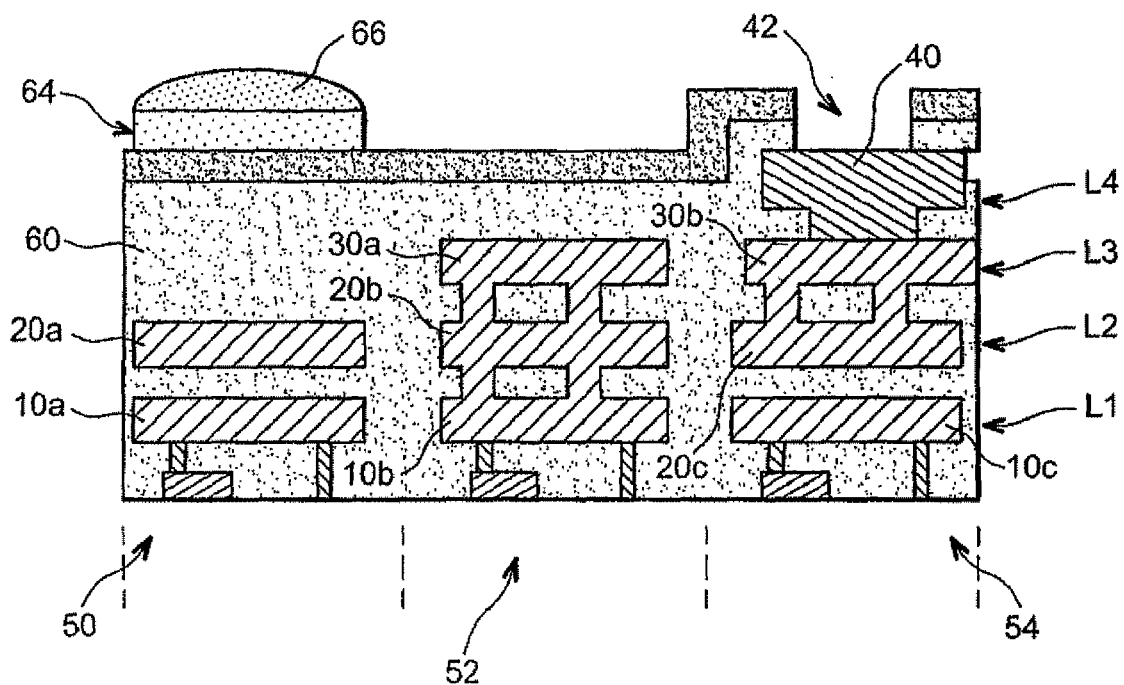
FIG. 1 illustrates an example of a microelectronic imaging device comprising a plurality of interconnection levels set out in the prior art.
Figure 2:
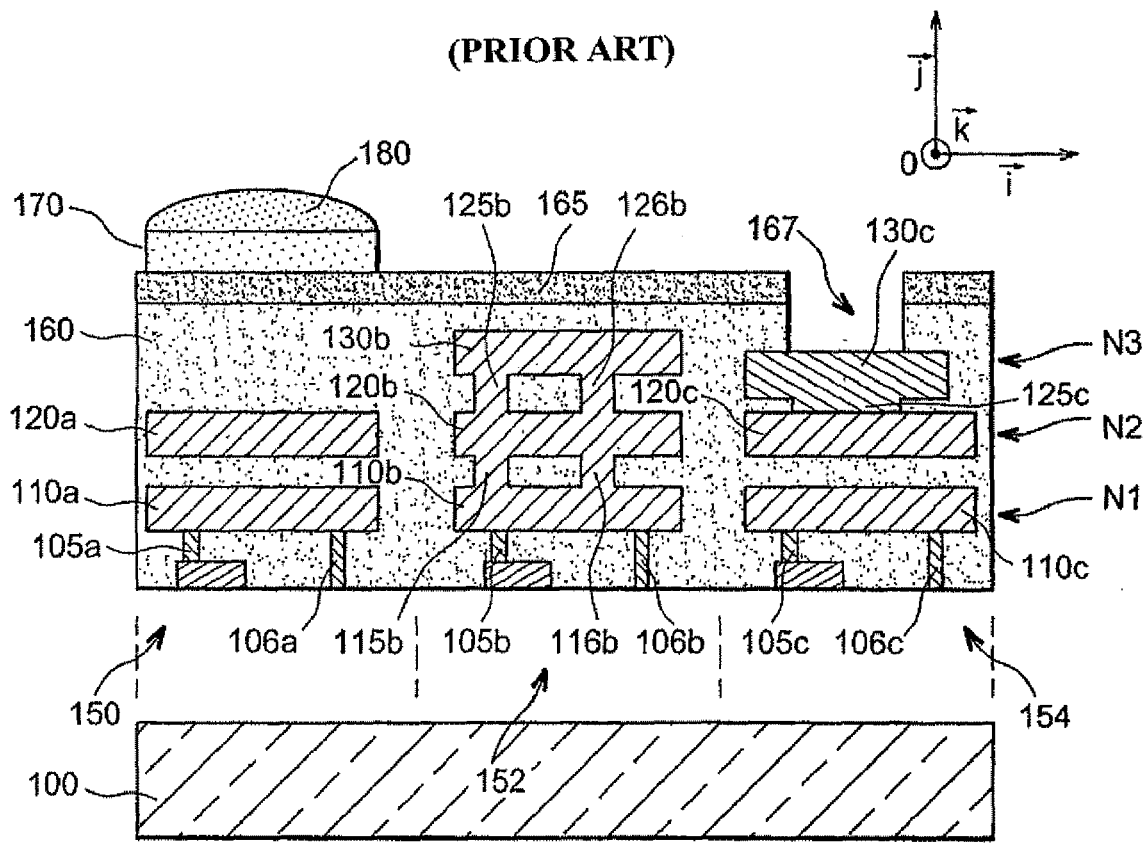
FIG. 2, illustrates an example of a microelectronic device of the invention.

One example of an imaging device or image sensor integrated circuit of the invention is illustrated in FIG. 2. This integrated circuit is formed on a substrate 100 and comprises, in a first zone, an optoelectronic circuit (shown by a block reference 150) also called an active matrix, and in a second zone, one or several command and/or processing (shown by a block reference 152) analog and/or digital circuits. In a third zone, positioned on the periphery of the first zone and the second zone, a block reference 154 comprise one or several circuits or elements of electronic interface circuit(s) between the matrix. The command and/or processing circuits and a system (not shown) are designed to accommodate the sensor. The block 154 may especially comprise, for example, an electrostatic discharge protection device (ESD), a data transmission protocol management device, and a distribution list of power supplies.

DETAILED DESCRIPTION OF THE PREFERRED EMBODIMENTS

The active matrix 150 is formed by a plurality of pixels or optoelectronic cells in the matrix. The cells or pixels are respectively equipped with at least one photoelectric detector, such as a phototransistor or a photodiode.

The imaging device is also equipped with several superposed metallic levels of interconnections of the matrix 150 and circuits 152, 154, for example, three levels N1, N2, N3, of interconnections. Several levels, for example, the two first metallic levels N1, N2 starting from the substrate 100 comprise conductive zones 110a, 110b, 110c, 120a, 120b, 120c based on a first metallic material, for example, a metal such as copper. Copper is selected for its good electrical conduction properties. Another level, for example, the third metallic level N3 features conductive zones based on the first metallic material, and other conductive zones based on a second metallic material, for example, another metal such as Aluminum. Aluminum is more ductile than the first metallic material or easier to model than the first metallic material. The second metallic material may be a material that is easy to weld and selected because it is easier to weld than the first metal. The second metallic material may be a material that is resistant to corrosion and selected because it is more resistant to corrosion than the first metal.

The first level N1 of interconnections features horizontal conductive lines 110a positioned opposite the active matrix 150, horizontal conductive lines 110b opposite the processing circuits 152, and one or several horizontal conductive lines 110c opposite the circuit 154 dedicated to testing. What is mean by horizontal conductive lines, is conductive lines positioned in a plane parallel to the main plane of the substrate 100. The main plane of the substrate 100 is defined as a plane passing through the latter that is parallel to the plane [O; $\vec{i}$; $\vec{k}$] with an orthogonal marker [O; $\vec{i}$; $\vec{j}$; $\vec{k}$], shown in FIG. 2. The horizontal conductive lines 110a, 110b, 110c of the first level N1 may be positioned in a same plane parallel to the main plane of the substrate 100.

The second metal level N2 may also feature one or several horizontal conductive lines 120a opposite the active matrix 150, one or several horizontal conductive lines 120b opposite the processing circuits 152, and one or several horizontal conductive lines 120c opposite the block 154. The horizontal conductive lines 120a, 120b, 120c of the second level N2 may also be positioned in a same plane parallel to the main plane of the substrate 100. The second level N2 of interconnections is connected to the first level of interconnections or the lower level N1 by means of vertical interconnections or vias. What is mean by vertical interconnections or vias, is conductive interconnection zones extending in a direction orthogonal to the main plane of the substrate 100. In FIG. 2, vias 115b and 116b connect a horizontal conductive line 120b of the second level N2 and a horizontal conductive line 110b of the first level N1 to one another.

The third level N3 of interconnections may also feature one or several horizontal conductive lines 130b based on the first metallic material positioned opposite the circuits 152, and conductive zones 130c based on the second metallic material positioned opposite the block 154. The third level N3 of interconnections, is connected to the second level N2 of interconnections by means of vertical interconnections or vias. In FIG. 2, a horizontal conductive line 130b of the third level N3, and a horizontal conductive line 120b of the second level N2, positioned opposite the processing circuits 152, are connected to one another by means of vertical interconnections or vias 125b, 126b, for example, based on the first metal, while at least one horizontal conductive line 120c based on the first metallic material, and at least one conductive zone, for example, a conductor pad 130c based on the second metallic material are connected to one another by means of at least one vertical interconnection 125c, which may be based on the second metal. The metallic levels N1, N2, N3, are located in an insulating layer 160 which may be formed by a stack of sub-layers of dielectric material(s) covering the active matrix 150 and the circuits 152, 154, for example, a stack of TEOS (Tetra Ethyl Ortho Silicate) oxide layers. The insulating layer 160 may itself be covered by another passivated insulating layer 165, for example, with a thickness of between 100 nanometers and 1 micrometer, and, for example, formed by a PSG (Phospho-Silicon Glass) based layer covered with a silicon nitride based layer.

Among the conductive zones based on the second metallic material and part of the third level N3 of interconnections, at least several conductive zones, for example, in the form of conductor pads 130c, are respectively revealed by at least one opening 167 in the passivated layer 165 and the insulating layer 160. Some of the conductor pads, based on the second metallic material that are part of the third metal level N3, may be provided for an assembly of the integrated circuit with a package, and are designed, for example, to be covered by a weld. Some other conductor pads of the third level N3, and based on the second metal, may be dedicated to testing the integrated circuit and are designed, for example, to be connected to an integrated circuit test device. The third level of interconnections is made so that the part of the insulating layer 160 covering the interconnections and the passivated layer 165 are flat.

The integrated circuit features the filtering elements 170 of a color filter, made on the passivated layer 165, and positioned opposite the active matrix 150. The color filter is formed by filter elements 170, for example, based on a colored resin or polymer, respectively capable of filtering a range of wavelengths from the visible light spectrum, and may be trichromatic, for example, of the RGB (Red Green Blue) type, or for example of the CMY (Cyan Magenta Yellow) type. The filtering elements may be set out according to a Bayer pattern. The filtering elements 170 may be respectively surmounted by a micro-lens 180, for example, resin based.

One example of a manufacturing method for the microelectronic device described above will now be provided. In this method, first the substrate 100, the active matrix 150, and the command and/or processing circuits 152, and the block 154 are made. Contacts 105a, 106a are connected to the matrix 150, contacts 105b, 106b are connected to the processing and/or command circuits 152 and contacts 105c, 106c are connected to the block 154. Contacts 105a, 106a, 105b, 106b, 105c, 106c, are also made. The contacts 105a, 106a, 105b, 106b, 105c, 106c, may be formed for example from a base of tungsten.

Then, the first interconnection level N1 is made comprising horizontal conductive lines 110a, 110b, 110c, based on the first metal, for example, copper. The creation of the first level N1 may comprise a step for depositing a dielectric material based layer that will be called first layer of dielectric material, for example, TEOS, and of a thickness, for example, of between 100 nanometers and 1 micrometer. Then, trenches are formed, for example, using plasma etching or RIE (Reactive Ion Etching) in the first layer of dielectric material. The trenches respectively reveal the contacts 105a, 106a, connected to the matrix 150, the contacts 105b, 106b, connected to the processing and/or command circuits 152, and the contacts 105c, 106c, connected to the block 154. Then, a flattening step (CMP) may be carried out. The trenches formed in the first layer of dielectric material are filled with the first metallic material, for example, with copper, so as to form the distinct conductive lines 110a, 110b, 110c. A chemical mechanical polishing step (CMP) may then be carried out on the conductive lines 110a, 110b, 110c. This polishing step may be carried out in order to make the surface of the conductive lines 110a, 110b, 110c flat and parallel to the main plane of the substrate 100.

Then, the second interconnection level N2 is created. A second layer of dielectric material is deposited, for example, TEOS based and with a thickness, for example, of between 100 nanometers and 1 micrometer. Then, the second layer of dielectric material is etched so as to form the holes provided for the metallic vertical interconnections, or vias, and respectively revealing a conductive line of the first level N1 of interconnections. Then, the second layer of dielectric material is etched again so as to form trenches, positioned in the extension of the holes, and provided for the horizontal conductive lines. According to one variant, after depositing the second layer of dielectric material, the latter may be etched so that the trenches provided for the horizontal conductive lines are formed first, and then the holes are provided for the metallic vertical interconnections or vias.

Then, the holes and the trenches are filled with the first metallic material, for example, copper to form the distinct horizontal conductive lines 120a, 120b, 120c, as well as the vias 115b, 116b. A chemical mechanical polishing step of the conductive lines 120a, 120b, 120c, for the second metal level N2 interconnection may then be carried out. This polishing step may be carried out so that the surface of the conductive lines 120a, 120b, 120c, of the second level N2 of interconnections is made flat and parallel to the main plane of the substrate 100.

Then, a third layer of dielectric material is deposited, for example, TEOS oxide based and with a thickness, for example, of between 100 nanometers and 1 micrometer. Then the third dielectric layer is etched to form one or several holes respectively revealing at least one conductive line 120c of the second level N2 positioned opposite the circuit 154. Then, a deposit is made of the second metal, for example, aluminum, to fill in the holes and form one or several metallic vias, such as that with reference 125c in FIG. 2. This filling may also be used to form an aluminum based layer with a thickness, for example, of between 100 nanometers and 1000 nanometers on the third layer of dielectric material. In the aluminum based layer, for example, by photo-etching, one or several conductor pads and/or one or several conductive lines positioned opposite the block 154 are made, like the pad with the reference 130c in FIG. 2. The aluminum based conductor pads may be etched, for example, using a mixture of $Cl+BCl_3$.

Then a fourth layer of dielectric material is deposited, for example, TEOS oxide based and with a thickness for example of between 200 nanometers and 4 micrometers. A chemical mechanical polishing step may then be carried out on the fourth dielectric layer.

The third and fourth layers of dielectric material are etched to form one or several holes, respectively revealing at least one horizontal conductive line 120b of the second level N2 of interconnections, provided for the vertical interconnections and trenches in the extension of the holes, provided for the horizontal conductive lines. The trenches may be formed before or after the holes.

Next, a deposit of the first metal is made, for example, copper, to fill the holes and trenches, and form vertical interconnections 125b, 126b and one or several horizontal conductive lines such as that with reference 130b formed opposite the circuits 152. One or several vertical interconnections, and one or several horizontal conductive lines based on the second metal may also be formed opposite the matrix 150 and the block 154.

Figure 3:
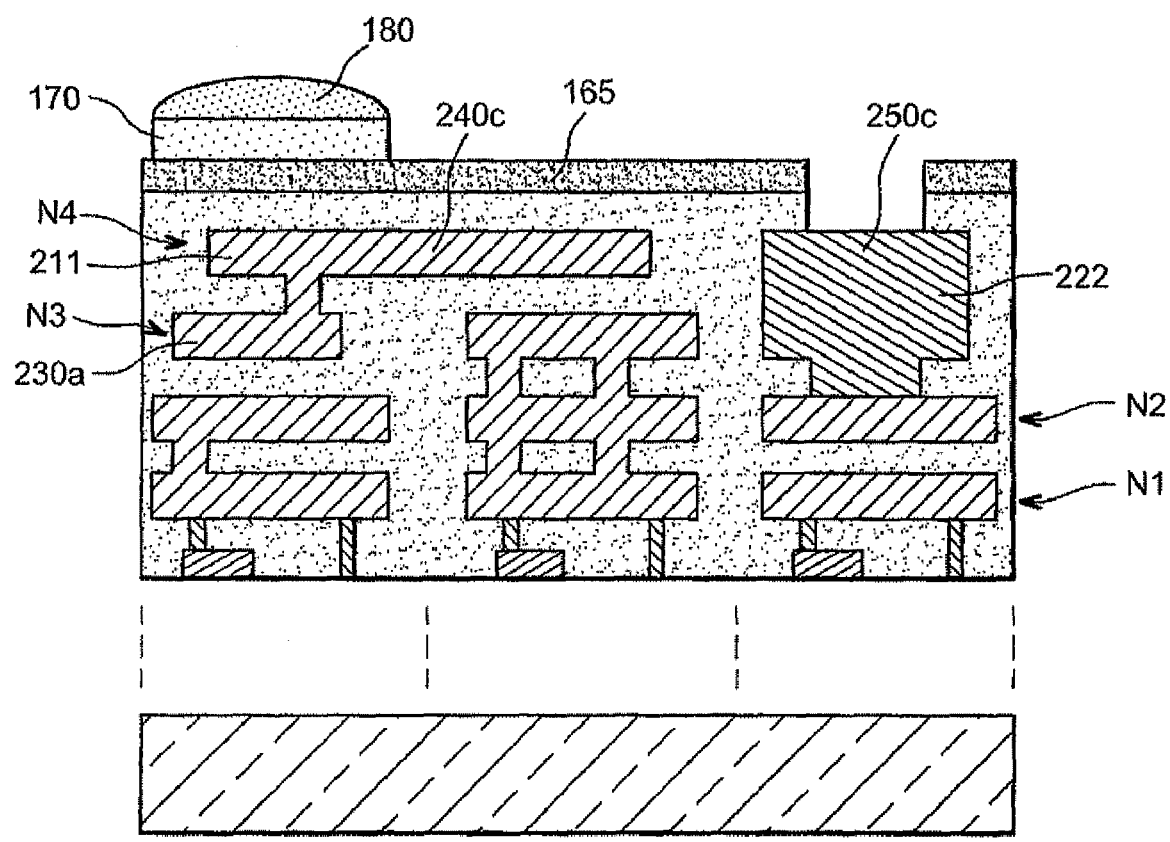
FIG. 3, illustrates another example of a microelectronic device of the invention.

Another example of an imaging device or image sensor integrated circuit of the invention is illustrated in FIG. 3. In this example, the imaging device is different from that previously described in relation to FIG. 2, in that it features four superposed metallic levels N1, N2, N3, N4, of interconnections. Several levels, for example, the two first metallic levels N1, N2 starting from the substrate feature conductive zones based on a first metallic material 211. For example, a metal such as copper, is selected for its good electrical conduction properties, while other levels, for example, the third metallic level N3 and the fourth metallic level N4, feature conductive zones 230$a$, 240$b$ based on the first metallic material 211 and other conductive zones based on a second metallic material 222, for example, another metal such as aluminum, that is more ductile than the first metallic material 211 or that is easier to model than the first metallic material 211. The second metallic material 222 may be a material that is easy to weld and selected because it is easier to weld than the first metal. The second metallic material 222 may be a material that is resistant to corrosion and selected because it is more resistant to corrosion than the first metal 211. Among the conductive zones based on the second metallic material 222, at least several conductive zones, for example, in the form of conductor pads 250$c$, are respectively revealed by at least one opening in the passivated layer 165 and in the insulating layer 160. Some of the conductor pads based on the second metallic material 222, may be provided for an assembly of the integrated circuit with a package and are designed, for example, to be covered with a weld. Some other conductor pads of the third level, and based on the second metal 222, may be dedicated to testing the integrated circuit and are designed, for example, to be connected to an integrated circuit test device. The third and fourth levels N3, N4 of interconnections are made so that the parts of the insulating layer 160, which cover the interconnections and the passivated layer 165, are flat. In this example, the pads 250$c$ based on the second metal 222 are made to a height substantially equal to the thickness occupied by the third level of metal N3 and the fourth level of metal N4.

That which is claimed is:

1. A microelectronic device comprising:
a substrate;
a plurality of components on said substrate;
an insulating layer adjacent said substrate; and
a plurality of metallic interconnection levels within said insulating layer and for said plurality of components, said plurality of metallic interconnection levels comprising
at least one given metallic level comprising a plurality of conductive lines of a first metallic material, and
another metallic level adjacent said at least one given metallic level and comprising
at least one conductive zone of the first metallic material and coupled to at least one of said plurality of conductive lines of said at least one given metallic level, and
at least one other conductive zone of a second metallic material and coupled to at least one other of said plurality of conductive lines of said at least one given metallic level,
the at least one other conductive zone of the second metallic material being co-planar with the at least one conductive zone of the first metallic material.

2. The microelectronic device according to claim 1, wherein said another metallic level is a last level of said plurality of metallic interconnection levels.

3. The microelectronic device according to claim 2, wherein said insulating layer has at least one opening defined therein and said at least one other conductive zone is revealed by the at least one opening.

4. The microelectronic device according to claim 3, wherein said at least one other conductive zone comprises at least one conductor pad to interconnect a circuit package.

5. The microelectronic device according to claim 3, wherein said at least one other conductive zone comprises at least one conductor pad to test the microelectronic device.

6. The microelectronic device according to claim 1, wherein the first metallic material is a better conductor of electricity than the second metallic material.

7. The microelectronic device according to claim 6, wherein the second metallic material is easier to weld than the first metallic material.

8. The microelectronic device according to claim 6, wherein the second metallic material is more resistant to corrosion than the first metallic material.

9. An image sensor comprising:
a substrate;
a plurality of image sensing components on said substrate;
an insulating layer adjacent said substrate; and
a plurality of metallic interconnection levels within said insulating layer and for said plurality of image sensing components, said plurality of metallic interconnection levels comprising
at least one given metallic level comprising a plurality of conductive lines of a first metallic material, and
another metallic level adjacent said at least one given metallic level and comprising
at least one conductive zone of the first metallic material and coupled to at least one of said plurality of conductive lines of said at least one given metallic level, and
at least one other conductive zone of a second metallic material and coupled to at least one other of said plurality of conductive lines of said at least one given metallic level,
the at least one other conductive zone of the second metallic material being co-planar with the at least one conductive zone of the first metallic material.

10. The image sensor according to claim 9, wherein said another metallic level is a last level of said plurality of interconnection levels.

11. The image sensor according to claim 10, wherein said insulating layer has at least one opening defined therein, and said at least one other conductive zone is revealed by the at least one opening.

12. The image sensor according to claim 11, wherein said at least one other conductive zone comprises at least one conductor pad to interconnect a circuit package.

13. The image sensor according to claim 11, wherein said at least one other conductive zone comprises at least one conductor pad to test the microelectronic device.

14. The image sensor according to claim 9, wherein the first metallic material is a better conductor of electricity than the second metallic material.

15. The image sensor according to claim 14, wherein the second metallic material is easier to weld than the first metallic material.

16. The image sensor according to claim 14, wherein the second metallic material is more resistant to corrosion than the first metallic material.

* * * * *